（12）United States Patent
Bippert

(10) Patent No.: US 10,762,247 B2
(45) Date of Patent: *Sep. 1, 2020

(54) SYSTEM AND METHOD OF PRODUCING A MULTI COMPONENT PRODUCT

(71) Applicant: The Coca-Cola Company, Atlanta, GA (US)

(72) Inventor: Douglas A. Bippert, Marietta, GA (US)

(73) Assignee: The Coca-Cola Company, Atlanta, GA (US)

( * ) Notice: Subject to any disclaimer, the term of this patent is extended or adjusted under 35 U.S.C. 154(b) by 296 days.

This patent is subject to a terminal disclaimer.

(21) Appl. No.: 15/472,111

(22) Filed: Mar. 28, 2017

(65) Prior Publication Data

US 2017/0262554 A1 Sep. 14, 2017

Related U.S. Application Data

(60) Continuation of application No. 14/148,529, filed on Jan. 6, 2014, now Pat. No. 9,607,109, which is a
(Continued)

(51) Int. Cl.
G06F 17/50 (2006.01)
G06Q 10/04 (2012.01)
(Continued)

(52) U.S. Cl.
CPC .......... G06F 30/00 (2020.01); G06Q 10/04 (2013.01); G06Q 30/0605 (2013.01)

(58) Field of Classification Search
CPC ..... G06F 17/50; G06Q 10/04; G06Q 30/0605
(Continued)

(56) References Cited

U.S. PATENT DOCUMENTS 4,109,314 A 8/1978 Meyer
4,955,507 A 9/1990 Kirschner et al.
(Continued)

FOREIGN PATENT DOCUMENTS

DE 102007032926 A1 1/2008
EP 1287458 A2 3/2003
(Continued)

OTHER PUBLICATIONS

Gabriel et al., "Quality of Orange Juice Drink Subjected to a Predictive Model-Based Pasteurization Process," Journal of Food Quality, 32(4):452-468, Aug. 2009 (Aug. 2009) <url:http://onlinelibrary.wiley,com/doi/10.1111/j.1745-4557.2009.00260.x/abstract>.
(Continued)

Primary Examiner — Jigneshkumar C Patel
(74) Attorney, Agent, or Firm — Dentons US LLP

(57) ABSTRACT

There is provided a method of regulating the formulation of a multi-component product comprising a product attribute profile, the method comprising providing a first and second component of the product, each component having a component attribute profile; supplying to a product formulation zone the first component and the second component in a desired ratio and combining the first and second components together to provide the product or a precursor thereof to yield a target product attribute profile; responsive to a change or predicted change in at least one component attribute profile, supplying information concerning the attribute change to a data processing apparatus and calculating with respect to that change an adjustment in the ratio to reduce the deviation of one or more attributes of the product attribute profile from the target product attribute profile. A production system is also provided.

16 Claims, 8 Drawing Sheets

Related U.S. Application Data division of application No. 12/940,276, filed on Nov. 5, 2010, now Pat. No. 8,639,374, and a continuation of application No. 12/940,265, filed on Nov. 5, 2010, now abandoned, and a continuation of application No. 12/940,252, filed on Nov. 5, 2010, now abandoned.

(51) Int. Cl.
   *G06Q 30/06*     (2012.01)
   *G06F 30/00*     (2020.01)

(58) Field of Classification Search
   USPC .......................................................... 700/103
   See application file for complete search history.

(56) References Cited

U.S. PATENT DOCUMENTS

| | | |
|---|---|---|
| 4,987,083 A | 1/1991 | Apple et al. |
| 5,450,317 A | 9/1995 | Lu et al. |
| 5,600,134 A | 2/1997 | Ashe et al. |
| 5,656,313 A | 6/1997 | Gibney et al. |
| 5,699,259 A | 12/1997 | Colman et al. |
| 5,765,143 A | 6/1998 | Sheldon et al. |
| 5,946,662 A | 8/1999 | Ettl et al. |
| 5,971,585 A | 10/1999 | Dangat et al. |
| 6,049,742 A | 4/2000 | Milne et al. |
| 6,135,319 A | 10/2000 | Camezon |
| 6,151,582 A | 11/2000 | Huang et al. |
| 6,260,477 B1 | 7/2001 | Tuyls et al. |
| 6,374,845 B1 | 4/2002 | Melendez et al. |
| 6,685,054 B2 | 2/2004 | Kameyama |
| 6,742,552 B2 | 6/2004 | Raniwala |
| 6,917,843 B2 | 7/2005 | Yeh et al. |
| 6,947,905 B1 | 9/2005 | Starr et al. |
| 7,058,587 B1 | 6/2006 | Horne |
| 7,085,730 B1 | 8/2006 | Tsao et al. |
| 7,107,113 B1 | 9/2006 | Morenz et al. |
| 7,130,712 B1 | 10/2006 | Ghosh et al. |
| 7,251,611 B2 | 7/2007 | Abbott et al. |
| 7,292,904 B2 | 11/2007 | Denton et al. |
| 7,379,905 B2 | 5/2008 | Beebe et al. |
| 7,395,228 B2 | 7/2008 | Seaman et al. |
| 7,444,295 B2 | 10/2008 | Peachey-Kountz et al. |
| 7,493,184 B2 | 2/2009 | Geroulo |
| 7,536,341 B2 | 5/2009 | Ouden |
| 7,590,937 B2 | 9/2009 | Jacobus et al. |
| 7,644,863 B2 | 1/2010 | Chen et al. |
| 7,660,730 B2 | 2/2010 | Hosoda et al. |
| 7,668,761 B2 | 2/2010 | Jenkins et al. |
| 7,716,077 B1 | 5/2010 | Mikurak |
| 7,747,339 B2 | 6/2010 | Jacobus et al. |
| 8,271,336 B2 | 9/2012 | Mikurak |
| 2002/0040302 A1 | 4/2002 | Gau et al. |
| 2002/0072988 A1 | 6/2002 | Aram |
| 2002/0122866 A1 | 9/2002 | Palaniappan et al. |
| 2002/0138324 A1 | 9/2002 | Zarefoss et al. |
| 2002/0169695 A1 | 11/2002 | Ko et al. |
| 2002/0178077 A1 | 11/2002 | Katz et al. |
| 2003/0018516 A1 | 1/2003 | Ayala et al. |
| 2003/0033180 A1 | 2/2003 | Shekar et al. |
| 2003/0036946 A1 | 2/2003 | Lin et al. |
| 2003/0061108 A1 | 3/2003 | Tu et al. |
| 2003/0065578 A1* | 4/2003 | Peyrelevade ........ A45D 44/005 705/14.54 |
| 2003/0083963 A1 | 5/2003 | Benson |
| 2003/0089739 A1 | 5/2003 | O'Connor et al. |
| 2003/0101179 A1 | 5/2003 | Lee et al. |
| 2003/0208392 A1 | 11/2003 | Shekar et al. |
| 2003/0211204 A1 | 11/2003 | Fields et al. |
| 2003/0229550 A1 | 12/2003 | DiPrima et al. |
| 2003/0233262 A1 | 12/2003 | Chorely et al. |
| 2004/0039650 A1 | 2/2004 | Lentz |
| 2004/0049415 A1 | 3/2004 | Liou et al. |
| 2004/0126474 A1 | 7/2004 | Letourneau |
| 2004/0128176 A1 | 7/2004 | Jordan et al. |
| 2004/0172321 A1 | 9/2004 | Vemula et al. |
| 2005/0075923 A1 | 4/2005 | Kolsky et al. |
| 2005/0123650 A1 | 6/2005 | Parente et al. |
| 2005/0211768 A1 | 9/2005 | Stillman |
| 2005/0214433 A1 | 9/2005 | Hardesty et al. |
| 2005/0256760 A1 | 11/2005 | Siddhanti |
| 2006/0064344 A1 | 3/2006 | Lidow |
| 2006/0113323 A1 | 6/2006 | Jones |
| 2006/0173728 A1 | 8/2006 | An et al. |
| 2006/0190362 A1 | 8/2006 | Krystek et al. |
| 2006/0265293 A1 | 11/2006 | Bengyak |
| 2007/0073557 A1 | 3/2007 | Abramson |
| 2007/0083413 A1 | 4/2007 | Srinivasan et al. |
| 2007/0136126 A1 | 6/2007 | Notani et al. |
| 2007/0168240 A1 | 7/2007 | Alfandary et al. |
| 2007/0192213 A1 | 8/2007 | Wu et al. |
| 2007/0248735 A1 | 10/2007 | Keithly et al. |
| 2008/0095906 A1 | 4/2008 | Zheng et al. |
| 2008/0133589 A1 | 6/2008 | Nickerson et al. |
| 2008/0156124 A1 | 7/2008 | O'Connor et al. |
| 2008/0177593 A1 | 7/2008 | Clayton et al. |
| 2008/0201241 A1 | 8/2008 | Pecoraro |
| 2008/0215410 A1 | 9/2008 | Cheng et al. |
| 2008/0228797 A1 | 9/2008 | Kenedy |
| 2008/0313194 A1 | 12/2008 | Shkedi |
| 2009/0037299 A1 | 2/2009 | Powell et al. |
| 2009/0063251 A1 | 3/2009 | Rangarajan et al. |
| 2009/0069932 A1 | 3/2009 | Rudick |
| 2009/0069933 A1 | 3/2009 | Rudick et al. |
| 2009/0069949 A1* | 3/2009 | Carpenter ............ B67D 1/0021 700/283 |
| 2009/0081339 A1 | 3/2009 | Evans et al. |
| 2009/0083123 A1 | 3/2009 | Powell et al. |
| 2009/0125350 A1 | 5/2009 | Lessing et al. |
| 2009/0136632 A1 | 5/2009 | Gutwein et al. |
| 2009/0164262 A1 | 6/2009 | Ettl et al. |
| 2009/0216613 A1 | 8/2009 | Steinbach et al. |
| 2009/0292573 A1 | 11/2009 | Gupta et al. |
| 2009/0299779 A1 | 12/2009 | Ettl et al. |
| 2009/0313090 A1 | 12/2009 | Armstrong |
| 2009/0327039 A1 | 12/2009 | Cox et al. |
| 2010/0036528 A1 | 2/2010 | Minard et al. |
| 2010/0070317 A1 | 3/2010 | Pachter et al. |
| 2010/0082157 A1* | 4/2010 | McGarel ............ G05B 13/048 700/265 |
| 2010/0082497 A1 | 4/2010 | Biesemann et al. |
| 2010/0088142 A1 | 4/2010 | El-Bakry et al. |
| 2010/0100216 A1 | 4/2010 | Ames, II et al. |
| 2010/0124592 A1 | 5/2010 | Anderson |
| 2010/0125486 A1 | 5/2010 | Sinclair et al. |
| 2010/0125487 A1 | 5/2010 | Sinclair et al. |
| 2010/0138276 A1 | 6/2010 | Bildmayer et al. |
| 2010/0139493 A1* | 6/2010 | Nevarez ............ B67D 1/0021 99/275 |
| 2010/0179663 A1 | 7/2010 | Agrawal et al. |
| 2010/0205044 A1 | 8/2010 | Scheer |
| 2010/0280895 A1 | 11/2010 | Mottola |
| 2011/0123688 A1 | 5/2011 | Deo et al. |
| 2011/0212229 A1 | 9/2011 | McLaughlin et al. |
| 2011/0251868 A1 | 10/2011 | Mikurak |
| 2012/0021102 A1 | 1/2012 | Milla et al. |
| 2012/0114813 A1 | 5/2012 | Bippert et al. |
| 2012/0114814 A1 | 5/2012 | Bippert et al. |
| 2012/0258217 A1 | 10/2012 | Weinzierl |

FOREIGN PATENT DOCUMENTS

| | | |
|---|---|---|
| JP | 2001266048 A | 9/2001 |
| JP | 2005057814 A | 3/2005 |
| WO | 2005062771 A3 | 9/2005 |
| WO | 2007002680 A2 | 1/2007 |
| WO | 2008075936 A1 | 6/2008 |
| WO | 2008130476 A1 | 10/2008 |

OTHER PUBLICATIONS

Rossi, "Least-Cost Feed Formulation Software: An Introduction," Aqua Feeds: Formulation & Beyond, 1(3):3-5, 2004.

(56) References Cited

OTHER PUBLICATIONS

Feed Manufacturing Technology, American Feed Manufactures Association, Inc., 1976.
Extended European Search Report for corresponding EP Application No. 11838827, dated Apr. 11, 2014, 8 pages.

\* cited by examiner

Input interface

| Plan ID | Revision ID |
|---|---|
| 20XX | XX+1 |
| 20XX | XX+2 |
| 20XX | XX+3 |
| 20XX | XX+4 |

| FG Quality Bound | Min | Max |
|---|---|---|
| Tuna | T1 | T2 |
| Ratio | R1 | R2 |
| Water | W1 | W2 |
| Sweet Corn | S1 | S2 |
| Preservative | PR1 | PR2 |
| Colour | C1 | C2 |
| Defect | D1 | D2 |
| Flavour | F1 | F2 |
| Texture | TR1 | TR2 |

| | |
|---|---|
| Number of weeks: | 4x |
| Start Date: | DD/MM/YYYY |
| Comments: | |

| Component Bounds | | Max | Switch |
|---|---|---|---|
| Tuna B | | JA1 | off |
| Water | | | on |
| Tuna A | | | on |
| Tuna C | | | on |

| End Supply | | Quantity | Switch |
|---|---|---|---|
| Tuna A | | TA1,234,567 | on |
| Tuna B | | TB1,234,567 | on |

Figure 5

Output Interface
PLAN ID

| Annual Cost | May XX | June XX | July XX | Aug XX | Sep XX | Oct XX | Nov XX | Dec XX |
|---|---|---|---|---|---|---|---|---|
| Solid Cost | SC1 | SC2 | SC3 | SC4 | SC5 | SC6 | SC7 | SC8 |
| Processing fee | PF1 | PF2 | PF3 | PF4 | PF5 | PF6 | PF7 | PF8 |
| Storage Cost | SPC1 | SPC2 | SPC3 | SPC4 | SPC5 | SPC6 | SPC7 | SPC8 |
| Transportation Cost | TRC1 | TRC2 | TRC3 | TRC4 | TRC5 | TRC6 | TRC7 | TRC8 |
| Cost per Gallon | CPG1 | CPG2 | CPG3 | CPG4 | CPG5 | CPG6 | CPG7 | CPG8 |

| Attributes | May XX | June XX | July XX | Aug XX | Sep XX | Oct XX | Nov XX | Dec XX |
|---|---|---|---|---|---|---|---|---|
| Ratio | R1 | R2 | R3 | R4 | R5 | R6 | R7 | R8 |
| Preservative | PR1 | PR2 | PR3 | PR4 | PR5 | PR6 | PR7 | PR8 |
| Water | W1 | W2 | W3 | W4 | W5 | W6 | W7 | W8 |
| Limonin | L1 | L2 | L3 | L4 | L5 | L6 | L7 | L8 |
| Texture | TR1 | TR2 | TR3 | TR4 | TR5 | TR6 | TR7 | TR8 |

| Component (gal) | May XX | June XX | July XX | Aug XX | Sep XX | Oct XX | Nov XX | Dec XX |
|---|---|---|---|---|---|---|---|---|
| Tuna A Fresh | | | | | | TAF6 | TAF7 | TAF8 |
| Tuna A Stored | TAS1 | TAS2 | TAS3 | TAS4 | TAS5 | TAS6 | | TAS8 |
| Tuna B Fresh | TBF1 | | | TBF4 | TBF5 | TBF6 | | TBF8 |
| Tuna B Stored | | TBS2 | TBS3 | | | | TBS7 | TBS8 |
| Total | TOT1 | TOT2 | TOT3 | TOT4 | TOT5 | TOT6 | TOT7 | TOT8 |

Figure 6

SYSTEM AND METHOD OF PRODUCING A MULTI COMPONENT PRODUCT

RELATED APPLICATIONS

This application is a continuation of and claims priority under 35 U.S.C. § 120 to U.S. patent application Ser. No. 14/148,529, now U.S. Pat. No. 9,607,109 entitled "Method of Production, Apparatus and System," filed Jan. 6, 2014, which is a divisional application of U.S. patent application Ser. No. 12/940,276, now U.S. Pat. No. 8,639,374, entitled "A Method of Production, Apparatus and System," filed Nov. 5, 2010. This application also is a continuation of and claims the benefit of and priority under 35 U.S.C. § 120 to U.S. patent application Ser. No. 12/940,252 entitled "Method of Juice Production, Apparatus and System," filed Nov. 5, 2010, and to U.S. patent application Ser. No. 12/940,265 entitled "Method of Beverage Production, Apparatus and System," filed Nov. 5, 2010. The disclosures of all the above listed applications are incorporated herein by reference for all purposes.

BRIEF DESCRIPTION OF THE INVENTION

The present invention generally relates to a method of producing, and apparatus and system for producing, a product. In particular, but not exclusively, the present invention relates to regulating a product attribute profile of a multi-component product.

BACKGROUND

A product intended for sale is generally produced each year in vast quantities to satisfy consumer demand, where the consumer may be the general public or a business enterprise. Traditionally, product manufacturers have relied on sales made in previous years to estimate the levels necessary for the upcoming year. However, guesstimating or employing "rules of thumb" carry the risk of manufacturing to significantly offset or out of date targets. Further, such techniques do not necessarily allow the manufacturing process to be optimized in terms of utilizing the raw materials to their fullest extent or in terms of maintaining a product having consistent component attribute profiles, for example taste, shelf life and costs, despite variances in the supply of the components of the product.

Products often contain a plurality of different components; for example sandwich filler may be constituted by a variety of different types of components—the composition determining the overall taste, texture and other properties of the resulting sandwich filler and consequently the sandwich. It, therefore, remains an important aspect of product production to maintain the properties of the product components to the extent that a consumer would fail to recognize a difference in the final product.

Consumer demand and price sensitivity are also important aspects to consider in product production. The volume of a product produced should be sufficient to meet consumer demand at a price consumers will bear.

Some of the problems and issues associated with existing and known product production methods may be due to the small number (three to four) of local experts in a given field making important decisions, which decisions can on occasion be conservative and be based on high levels of assumption and uncertainty. The experts may rely on experience and a rule of thumb which the reader will acknowledge may not always be an accurate way to apply processes consistently. Such techniques and procedures are often restricted in terms of the low level of critical data that is able to be shared among decision making parties.

It is desirable, therefore, to provide a mechanism to link consumer demand with manufacturing supply, while enhancing the efficiency of the production process so that waste of raw material is minimized and product attribute profile consistency is regulated and maintained.

SUMMARY

According to a first aspect, the present invention encompasses a method of producing a multi-component product comprising a product attribute profile, the method comprising providing a first and second component of the product, each component having a component attribute profile; supplying to a product formulation zone the first component and the second component in desired amounts and combining the first and second components together to provide the product or a precursor thereof to yield a target product attribute profile; responsive to a change or predicted change in at least one component attribute profile, supplying information concerning the attribute change to a data processing apparatus and calculating with respect to that change an adjustment in the amounts to reduce the deviation of one or more attributes of the product attribute profile from the target product attribute profile.

The attribute profile of the product may be considered to be the intrinsic characteristics of the product. The attribute profile relates to the properties of the product. Similarly, the component attribute profile relates to characteristics and properties of the component of the product. For example, the age of the product may be regarded as quantifiable attribute data. Of course, quantifiable attribute data may be constituted by other information relating to the product.

The product attribute profile or the at least one component attribute profile may be selected from the cost of freight and storage of a particular component, cost of a particular component, quality of a particular component, consumer demand of a particular component, available supply of a particular component and cost of processing/blending. For example, when the freight and storage cost of a particular component is high, it may be preferred to resort to an alternative component that exhibits, for instance, similar or identical characteristics to the original component, but has lower associated costs. The cost of the overall process can in this way be reduced, thereby optimizing the way in which a product is produced. Similarly, when the quality or available supply of a particular component is negatively affected or is predicted to be negatively affected in the future, for instance, the method involves the step of adjusting the ratio or amounts of the components to counteract such a change or predicted change so as to reduce the deviation of the product attribute profile from an existing or target product attribute profile.

It is desirable for the physical properties of the product to be regulated and this can be achieved by supplying information concerning any attribute profile change or anticipated change to the system, for instance to a database, and then calculating how to minimize or reduce the change. In some circumstances, it may not be possible to replace a like component with a like component; in which case, a replacement component can be selected which most closely matches the necessary attribute(s) of the component to be replaced.

A component of the product may be considered a particular type of constituent of the product. Where the product is sandwich filler, for example, it may include a component such as chicken originating from a particular source. In other cases, it may be the same type of constituent but having different properties; for instance, chicken taken from two different regions and having different attributes profiles such as taste and availability.

An attribute of a component may fluctuate over time by increasing or decreasing. For example, where the attribute is the cost of a particular component, the cost may increase or decrease depending on various contributing factors such as season, availability and demand.

The target product attribute profile may be understood as the attribute profile that is desirable. It may be considered as the attribute profile that is "ideal" in terms of initial values. The optimal combination can be obtained by setting constraints in the system so as to arrive at the desired product attribute profile. There may be varying degrees of acceptability of the deviation from the target product attribute profile; this may, for example, be in the region of +/−5% of the target product attribute profile value(s).

It will be appreciated that the adjustment in the ratio of components may be "zero". For instance, a product may consist of initial components X, Y and Z. An adjustment may be calculated such that initial component X of the product is replaced with a similar, but not identical, component Q having a very similar attribute profile to initial component X. However, the ratio between the components of the product may not change in that component X may be replaced with component Q in identical amounts, so that the ratio of components X, Y and Z is the same ratio as that of components Q, Y and Z. In such a case, the ratio change would be calculated as "zero"; however, the product has still been adjusted in the sense that the components of the product have been exchanged with the intention of maintaining a consistent product attribute profile.

The information acquired on the at least one component attribute profile may involve consumer intelligence gathered via sensory attributes. Both chemical and physical attributes may be measured.

One or more embodiments address the problem of how to maximize the quality of a product with the currently available supply of components. It is desirable to replace a component or change the blend ratio without detriment to the quality and taste of the product. One or more embodiments enables long-term planning solutions and flexibility to consider new sources and suppliers of components while maintaining the consistency of the product. This may be by virtue of forecasted future crop attributes, for example.

It will be readily apparent to the reader that many other attributes are also applicable which are encompassed by the embodiments described herein and variants thereof.

In one or more embodiments, the raw material and physical characteristics, costs and other attributes may be input into revenue analytics software, which may process the information and provide a predictive modeling score. This score may be used to optimize the process by purchasing raw materials that have identifiable measurable attributes. The raw materials thus purchased may be recorded and their corresponding measured component attribute profiles may be fed into a database. Various calculations can be made based on various potential scenarios, and the materials may then be selected/combined based on the target product attribute profile; for example a product having a certain quality or particular cost.

The component attribute profiles may be manually input into a database or this may be an automated procedure. The database may be in the form of a spreadsheet which stores the information.

Rather than important decisions in the production of products being made by a small number of experts, one or more embodiments in accordance with the present method enables a cross-functional decision making process with general managers included in key decisions. To this end, robust planning can be executed at a very detailed level based on data-driven decisions. There is also enhanced visibility such that critical data is common among relevant parties so that appropriate and informed decisions can be made.

It is often the case that major decisions can be based on experience, but the minor decisions do not always follow this rule and less than optimum decisions can, therefore, be made. As an example, it may be the case that 95% of components of a product are utilized in the most efficient manner, but the remaining 5% may be unusable due to guesstimation. One or more embodiments of the present method allow optimization in the sense that substantially the final 5% would also be utilized in the most efficient manner owing to information supplied to the database on component attributes and anticipated component attributes. As a result, there is provided a decision support capability.

One or more embodiments in accordance with the method enables infrastructure planning to the effect that an attribute change of a component is recognized quickly or is predicted in advance of such change, so that it becomes possible to manage the logistics of the operation more efficiently compared with having to react to sudden changes, such as a realization that a particular component is no longer available. By contrast, one or more embodiments in accordance with the present method recognizes that there may be a shortage in supply of particular component and adjust the ratio of the components to account for this change without necessitating an entirely new product—instead the components of the product may be substituted with those that most closely resemble the attribute profiles of the initial components, thereby maintaining as much as possible the overall product attribute profile. In another example, the information may provide for an increase in supply of a component and arrangements may then be made in advance for additional storage capacity of the product.

The attribute profile of availability of a particular component or supply thereof may be influenced by a variety of factors, including seasonal variations in growth, natural disasters, a change in importation/export duties and changes in transport of the component.

One or more embodiments in accordance with the method thus provide a way in which to regulate the attributes of a product. One or more embodiments in accordance with the method rely on information supplied to the database, which information may be considered more reliable than traditional demand forecasting because the information is acquired from a direct source in the form of the consumers that will eventually purchase the end product, rather than information based purely on previous year(s) sales figures, which can be misleading.

Supply of components can in this way be linked to consumer demand to enable quicker and more precise decisions, while optimizing profitability and growth. It could be said that the method synchronizes and optimizes decisions involving the initial product components to the final product. In this way, the correct product may be offered to the correct consumer at the correct time for a correct amount. Correct may be understood as meaning suitable.

One or more embodiments in accordance with the method allow the attributes of a multi-component product to be optimized such that raw material waste is minimized. Raw materials which may constitute the components of the product, for instance chicken used to make the product, can be selected in the correct quantities by way of the present method, thereby reducing waste. The correct quantities can be established, for example, from the information acquired from the consumers together with any predictions relating to component availability.

The product may include components from at least two different sources. This may include, for example, the same type of chicken taken from different locations. Of course, in some cases, the source may be in the same geographical location for all components, but the components may originate from different types of product, such as different type of chicken (standard or free range).

The first and second components may reside in separate vessels before being combined. Regulation of the attribute profile of the product may be enhanced by keeping the components separate before combining. The step of adjusting the ratio or amounts of the components is made easier by keeping the components separate so that appropriate amounts of components can be selected when required.

The vessels may include valves for allowing controlled passage of the components to the product combination zone. The components may then be combined in the desired ratios in a controlled manner to provide an accurate product composition.

The method may further comprise automatically adjusting said ratio to reduce said deviation.

The adjustment in the ratio may comprise replacing said first component or said second component with a third component having an attribute profile in a desired ratio to yield said target product attribute profile.

The method may further comprise automatically recognizing the availability of said third component and calculating said adjustment in dependence on said availability.

The product may include components from at least two different sources.

The adjustment in the ratio to reduce the deviation of one or more attributes of the attribute profile from the target attribute profile may be calculated with respect to a selected period of time. The selected period of time may be the longest possible period of time, a period of time between the present and subsequent change, a season of the year or any other time period.

The method may include the step of marketing and promoting the product in response to sufficient existing and anticipated stock levels of the juice.

The method may be a computer implemented method and the calculating step may be executed by a data processor.

The attribute of at least one component of the product may fluctuate over time.

One or more embodiments in accordance with the present invention thus allow the modeling of product component attributes by representing their properties and characteristics in data form.

There are various ways the component information may be utilized. For example, the data for a particular product may be input to a central database. The data may form an optimization plan or framework for producing a product from known available components. The various parameters may be continuously updated. In this way, the optimization of the method occurs by using the existing data and combining it with the new data/information so that a new or modified optimization plan can be generated. In such an example, the method allows the user to build on a previous model or models, rather than relying on a completely new model each time. Optionally, a user may input data for a particular plan each time there is a change or expected change in requirements for the product to be produced or of the components of the product.

Another way of optimizing may include inputting all the information into a database. Then, in the event of a new scenario, the optimization module may review the information received and acquire any missing data (in terms of previously known data) from the database before running the optimization sequence.

The data or information on component attributes should be viewed not simply as data, but a representation of the physical components and product, and by representing the product components and product in terms of their key attributes, it is possible to model a simulation for optimizing a product combination made from several product components.

So far as the taste attributes are concerned, the optimization of the combined product can thus be seen as the optimization of the physical sensation experienced by the consumer when consuming the combined product, the optimization taking place in an electrical or virtual environment. Furthermore, other physical aspects such as availability of component products may also be taken into account.

Viewed from a hierarchical perspective, the combination falls within an objective constraint, such as cost per unit volume to manufacture or to the consumer.

The constraints and attributes may be considered simultaneously, for example.

There is also generally a quality constraint which is a function of a subset of the attributes, for example taste attributes.

Additionally, a constraint may be viewed as a bound on an attribute or a function of one or more attributes.

In accordance with an embodiment of the present invention, the method is directed towards regulating the formulation of a product having a target product attribute profile. The attribute profile may be viewed as a constraint in the formulation optimization model. Optionally, the target product attribute profile may be subject to an overriding constraint such as total cost of the product combination.

The constraint or constraints may include quality and component bound constraints which enforce the quality and component bounds for finished products. Other constraints may include supply and demand constraints involving sourcing of raw materials. Additionally, capacity constraints may also play a factor in determining the optimization model of a product; i.e. how much of a product may be produced and stored for an adequate period before sale. In this way, logistical constraints are an important consideration for the optimization model.

The adjustment in the ratio or amounts to reduce the deviation of one or more attributes of the product attribute profile from the target product attribute profile may be calculated with respect to a selected period of time. The attribute profile of a component may change over time; similarly, the attribute profile of a product may change over time. Hence, where the product is a vegetable for example, it is possible that the attribute profile of a particular component changes by season. More specifically, the price of the vegetable may vary from season to season, and adjustments to the ratio or blend of the product may be necessary, for instance, to keep the cost of the product within an acceptable range or below a certain threshold or to keep the other vegetable attributes such as its taste consistent over the different seasons. Such adjustments may involve replacing component(s) entirely or modifying the ratios/amounts of the existing components.

The selected period of time may be the longest possible period of time, a period of time between the present and subsequent change, a season of the year or any other time period that may be appropriate for the desired yield.

One or more embodiments in accordance with the method may include the step of marketing and promoting the product in response to sufficient existing and anticipated stock levels of the product. There is a direct link between supply and consumer demand. During periods where supply of a particular component is short or expected to be short, for instance, it may be prudent to refrain from marketing or promoting the product since its supply will be affected and it may not in such circumstances be possible to meet the demands of the consumers. Conversely, when the acquired information on component attributes shows that supply will be readily available, it may be beneficial to market and promote the product thereby increasing potential sale of the product, which increase in sale can be readily met by virtue of the increased availability of components.

In one or more embodiments, the method may be a computer implemented method and the calculating step executed by a data processor.

There are various ways the method allows the component information to be utilized. For example, the data is inputted to a central database where various parameters are continuously updated. In this way, the optimization of the method occurs by using the existing data and combining it with the new data/information so that a new optimization plan can be generated. The method, therefore, allows the user to build on previous model, rather than relying on a completely new model each time.

Another way of optimizing may include inputting all the information into a database. Then, in the event of a new scenario, the optimization module may review the information received and acquire any missing data (in terms of previously known data) from the database before running the optimization sequence.

The data or information on component attributes is not simply data, but a representation of the physical attributes of the product, and by representing the product in terms of its key physical attributes, it becomes possible to model a simulation to optimize a combination made from several components.

The method may be a computer implemented method and the calculating step may be executed by a data processor.

According to a second aspect, the present invention provides a system for producing a multi-component product comprising a product attribute profile, the system comprising means for storing a first and second component of the product, a product formulation zone for combining the first and second component of the product in desired amounts effective to yield a target product attribute profile, the first and second component each having a component attribute profile, wherein the system comprises a data processing apparatus operable to receive information concerning a change or predicted change in at least one component attribute profile and, in response thereto, is operable to calculate with respect to that change an adjustment in the amounts to reduce the deviation of one or more attributes of the product attribute profile from the target product attribute profile.

The means for storing the first and second components may comprise separate vessels in the system.

The formulation zone may comprise a combination chamber in the system. The size of the combination chamber may be dependent on the intended production size and rate of the product.

According to a third aspect, the present invention provides a computer implementable method of modeling the production of a multi-component product comprising: representing said multi-component product by data values indicative of a physical attribute profile of said multi-component product; representing first and second components of said multi-component product by data values indicative of respective physical attributes of said first and second components; and deriving a combinatorial relationship between respective data values of said physical attributes of said first and second component to yield a combined attribute profile within predetermined limits of data values of said multi-component product attribute profile.

Representing physical attributes or characteristics, for example attributes of a product contributing to a taste sensation as data values, allows the production and formulation of products to be modeled and simulated in an electric or virtual environment. Thus, natural resources such as products need not be wasted in trying out formulations or manufacturing consistency.

The attributes may be taste sensation attributes.

The method may further comprise applying a constraint to deriving said combinatorial relationship.

The constraint may comprise a data value or range of data values representative of the cost of said multi-component product.

The constraint may comprise a further data value or range of data values representative of an available amount of said first and/or second components.

The constraint may comprise a yet further data value or range of data values representative of an amount of multi-component product to be produced.

The combinational relationship may comprise a ratio of said first component to said second component.

The method may further comprise providing control parameters derived from said combined attribute profile to a multi-component production system for controlling the supply of said first and second component to a formulation zone in amounts corresponding to said combinatorial relationship for combining to form said multi-component product.

There is also provided a computer program comprising computer program elements operative in data processing apparatus to implement the method defined herein.

According to a fourth aspect of the present invention, there is contemplated the use of the system such as set out above and according to any of the appended system claims in regulating a multi-component product attribute profile.

BRIEF DESCRIPTION OF THE DRAWINGS

Various embodiments of the present invention will now be described more particularly, by way of example only, with reference to the accompanying Figures; in which:

FIG. 5 is an illustration of an input interface display screen in accordance with an embodiment of the present invention;

FIG. 6 is an illustration of an output interface display screen in accordance with an embodiment of the present invention;

DETAILED DESCRIPTION OF THE DRAWINGS

Figure 1:
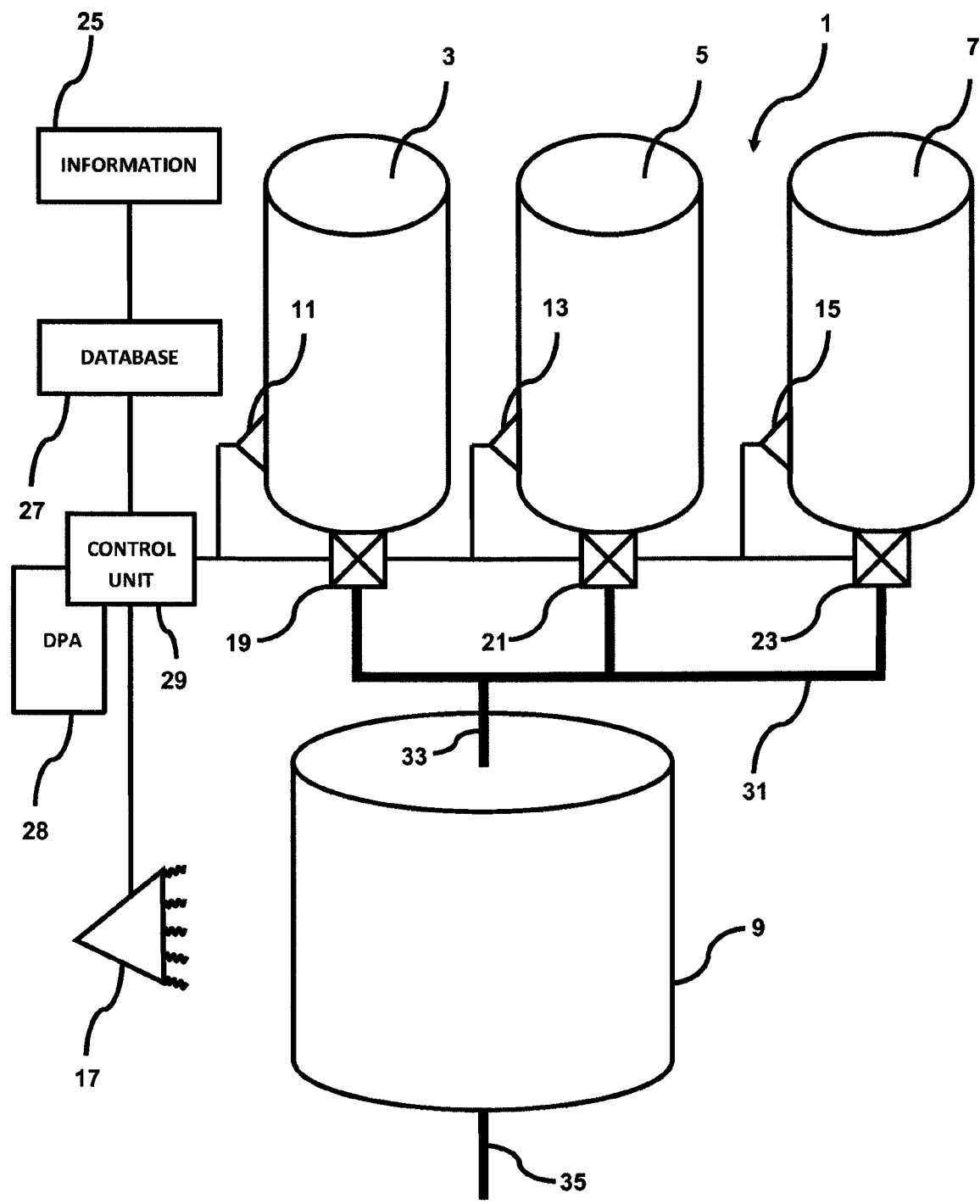
FIG. 1 is a schematic representation of a system for the production of a multi-component product in accordance with an embodiment of the present invention.

Referring first to FIG. 1, there is illustrated a schematic diagram of a system for the production of a multi-component product having a product attribute profile. The system is generally indicated 1.

The system 1 comprises a database 27 for storing information 25 concerning consumer preferences in terms of the measurable properties or attributes of the components. The information 25 also includes constraints including supply, demand and cost of particular components. The system 1 also comprises three product component vessels 3, 5 and 7, which feed into a formulation zone constituted by a combination chamber 9. The vessels 3, 5 and 7 and combination chamber 9 are provided with monitoring devices 11, 13, 15 and 17 respectively. Each vessel 3, 5 and 7 is also provided with a valve 19, 21 and 23, respectively for controlling the flow of respective components to the combination chamber 9.

In the described embodiment, the product component vessels 3, 5 and 7 and the combination chamber 9 are cylindrical in shape, which aids combining and flow therethrough.

The monitoring devices 11, 13, 15 and 17 monitor the properties of the product components and product formulation in respective vessels 3, 5 and 7 and combination chamber 9 and supply this information to the database 27 via the control unit 29. In this embodiment, vessel 3 contains sweet corn, vessel 5 contains tuna A and vessel 7 contains tuna B. Measurable properties or attributes of the respective components and the sandwich filler include for example the texture and viscosity, tuna concentration and acidity may be monitored. The monitoring devices 11, 13, 15 and 17 include, either integrally or remotely, analytical apparatus for performing High Performance Liquid Chromatography and Gas Chromatography (not shown).

The information corresponding to the properties or attributes represents a particular component, such as a sandwich filler component or sandwich filler product. In this way, a physical combination may be represented by a formulation having data values representative of physical properties. Further attributes could also be monitored or derived such as the volume of product present, its temperature thereby delimiting the product in further detail. Representing physical substances as data values allows the modeling of the substance in data processing apparatus.

Figure 2:
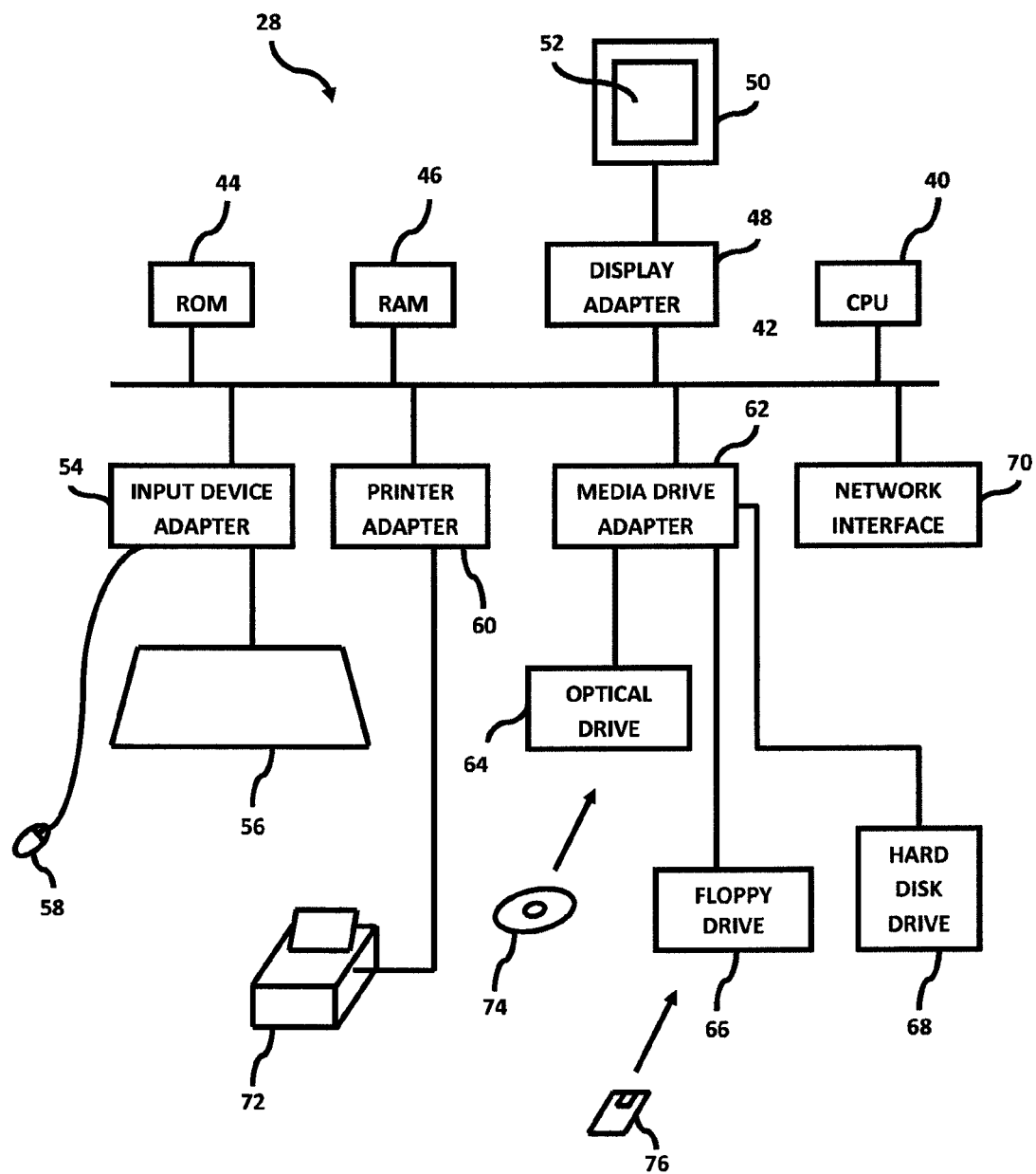
FIG. 2 is a block diagram illustrating the components of a data processing apparatus.

Information 25 acquired on consumer preferences, including taste attributes of preferred tuna content, sweet corn content and texture are supplied to the database 27. Control unit 29 may include data processing apparatus 28 such as schematically illustrated in FIG. 2. Here, there is shown a schematic and simplified representation of an illustrative implementation of a data processing apparatus 28 in the form of a computer system. As shown in FIG. 2, the computer system comprises various data processing resources such as a processor (CPU) 40 coupled to a bus structure 42. Also connected to the bus structure 42 are further data processing resources such as read only memory 44 and random access memory 46. A display adapter 48 connects a display device 50, having a display screen 52, to the bus structure 42.

One or more user-input device adapters 54 connect the user-input devices, including the keyboard 56 and mouse 58 to the bus structure 42. An adapter 60 for the connection of a printer 72 is also provided. A media drive adapter is provided for connecting the media drives, including the optical disk drive 64, the floppy disk drive 66 and hard disk drive 68, to the bus structure 42. A network interface 70 is provided thereby providing processing resource interface means for connecting the computer system to one or more networks or to other computer systems. The network interface 70 could include a local area network adapter, a modem and/or ISDN terminal adapter, or serial or parallel port adapter etc., as required. In this embodiment, the network interface 70 is in communication with the database 27 of FIG. 1.

It will be appreciated that FIG. 2 is a schematic representation of one possible implementation of a computer system. It will be appreciated, from the following description of embodiments of the present invention, that the computer system in which the invention could be implemented may take many forms. For example, rather than the computer system comprising a display device 50 and printer 72, it may be merely necessary for the computer system to comprise a processing unit, and be accessible to other computer systems.

A CD-ROM 74 and a floppy disk 76 are also illustrated. A computer program involving an algorithm for implementing various functions or conveying information can be supplied on media such as one or more CD-ROMs 74 and/or floppy disks 76 and then stored on a hard disk 68, for example. A program implementable by the computer system may also be supplied on a telecommunications medium, for example over a telecommunications network and/or the Internet, and embodied as an electronic signal.

The data processor 28 is configured to access consumer preference information 25 and generate an electronic representation of a desired combination formulation as data values of a target product attribute profile based on the consumer preferences. The target product attribute profile is an "ideal" profile in that it is generated, in this embodiment, without considering constraints such as cost and availability of component products. Thus, the target product attribute profile is an attribute profile of the product which possesses the desirable characteristics based on consumer preference information 25—in this case, the desired properties of the product combination that will determine its taste and mouth sensation. The target product attribute profile may be viewed as a product quality index and typically each attribute may have a range of values.

The data processor 28 is further configured to deduce the ratio of product components (e.g. ratio of tuna to sweet corn content) necessary to achieve a filler having an attribute profile satisfying the target attribute profile. For example, the user can provide multiple product components, each containing unique attributes, usage limitations (e.g., component availability and timing) and costs. The data processor will simultaneously consider all of these factors in determining how to match each component to meet or exceed the target attribute profile for the entire production period whilst minimizing cost.

Thus, formulating a product blend may be controlled automatically following deduction of the product component ratios or amounts for satisfying the target attribute profile. Optionally, parameters representing the ratio or amounts may be displayed to a user on a display screen 52 and control unit 29 configured with those parameters by a user. The ratio can be input to the control unit 29, which in turn operates valves 19 and 21 to supply product components in the desired ratio to the inlet 33 of combination chamber 9 conduits 31. Combining occurs in the combination chamber 9 on the principles of a continuous flow reactor. The amount of the tuna A and sweet corn in the filler can be controlled in real-time by adjusting the flow of the components to the combination chamber 9 based on readings from the monitoring device 17 fed back to control unit 29. The components are combined to yield a formulation satisfying the target product attribute profile.

In this and other embodiments, information 25 may include more than information concerning consumer preferences; for example, estimated product sales based on product component attributes, product component availability and cost per component of the product. This information may be continually updated and input to the database 27. The control unit 29 also receives current information on the attribute profile of each component from the monitoring devices 11, 13, 15 (before 20 combining has occurred). The control unit 29 also receives current information on the attribute profile of the formulated product from the monitoring device 17 (after combining has occurred). The status of the attribute profiles of the components and the product combination are, therefore, known by way of the monitoring devices 11, 13, 15 and 17. In an optional embodiment, the updated attribute profile status is input to data processing apparatus 28 which is configured to be responsive to the updated status to deduce an updated component ratio and forward the ratio to control unit 29. The control unit 29 then sends control signals to the relevant valves 19, 21 and/or 23 to adjust the flow of components to the combination chamber 9.

Following a change or predicted change (based on acquired information 25) in a component attribute profile, for example the reduced availability of tuna A, the change is included in information 25 and supplied to the database 27. The data processor 28 accesses the information 25 in the database 27 and establishes whether the change or predicted change will result in an unacceptable deviation from the target product attribute profile. If such a deviation is identified, the data processor 28 deduces how best to counteract the deviation by generating an updated component ratio which more closely yields the target product attribute profile.

The data processor 28 can establish that a deviation is likely to occur due to the reduced availability of sugar. In this particular case, the data processor algorithm generates a solution to this problem; more particularly an adjusted ratio/combination of the components which would minimize the deviation owing to the reduced availability of tuna A. In this embodiment, the data processor 28 calculates that the tuna A of vessel 5 can be replaced by tuna B due to similar component attributes, whereby to minimize the deviation of the target and current product attribute profiles.

Using the calculated adjustment, an operator can manipulate the control unit 29 to make said adjustment to the combination of the formulation in combination 21 chamber 9 by closing valve 21, belonging to vessel 5, and opening valve 23, belonging to vessel 7. The adjustment is made by effectively replacing tuna A with tuna B. Of course, in other embodiments, a component may not be entirely replaced; instead the amount supplied of a particular component may change. Optionally, the adjustment may be made automatically in that updated control parameters to modify the product component ratio/amount input to the combination chamber 9 are sent to the control unit 29. The control unit 29 may then send control signals to valves 19, 21 and 23 to adjust the flow of components to incorporate tuna B from vessel 7.

Following said adjustments, filler from sweet corn and tuna B may be extracted from the combination chamber 9 by way of the outlet 35.

Referring back to FIG. 2, the memory resources, typically RAM 46 and HDD 68 comprise information on the various components of the product; in the present example, these components include: component I (sweet corn) having component attribute A, component j (tuna A) having component attribute B, and component k (tuna B) having component attribute C. These memory resources of the produced product, i.e. the customer preferences, also contain the system constraints in terms of quality constraints including taste attributes, and operational constraints including minimum supplier purchases, load-out constraints, end-supply requirements, combining/blending constraints, pasteurizing capacity and safety stock limit.

The memory resources also store computer elements, typically in the form of instructions and parameters, for configuring data processing apparatus 28 to retrieve data from database 27, process the data to deduce the ratios of product components to combine in the combination chamber 9, and also to receive real-time attribute data from the system 1 to utilize in deducing the ratios/amounts of product components for achieving the target attribute profile of the combined product. Among the computer program elements there is included an optimization module, an input interface template and output interface template module.

It will be appreciated that although the embodiment of FIG. 1 relates to food, in other embodiments the product may be non-food related such as a concrete mixture, for example. The concrete mixture may include components such as cement and sand mixed in the appropriate proportions. Adjustment could be made to the components of the concrete mixture on the same principles as described in relation to FIG. 1.

Figure 3:
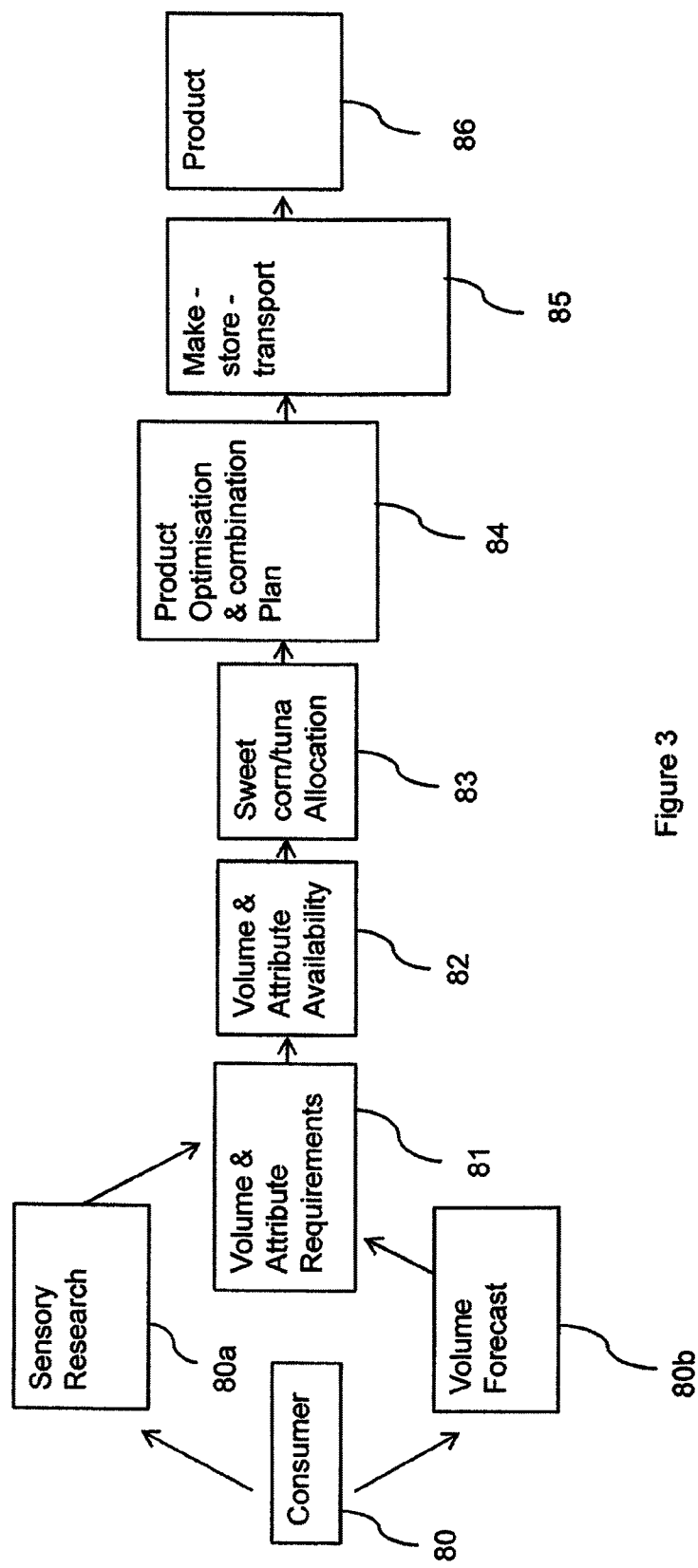
FIG. 3 is a schematic overall process flow diagram illustrating a system regulating the formulation of a multi-component product having a product attribute profile.

The overall process flow of a system regulating the formulation of a multicomponent product attribute profile implementing an embodiment of the present invention will now be described with reference to FIG. 3.

The overall process begins with the preference information 80 initially providing sensory research 80*a* and volume forecast data 80*a* on the product to be produced. An analysis is made of the volume 81 and attribute requirements 82 of the product components depending on volume and attribute availability. For example, if the resources of tuna were limited in terms of availability, it may be prudent to allocate the limited resource to a particular market to achieve the optimal scenario. This may, for example, involve allocating to a particular market or production region to maximize quality of product or overall profits. An optimization and combination plan is formulated 84. The product is combined, adjusted if necessary, stored and transported 85, which results in a final product 86 issued to the consumer.

Figure 4:
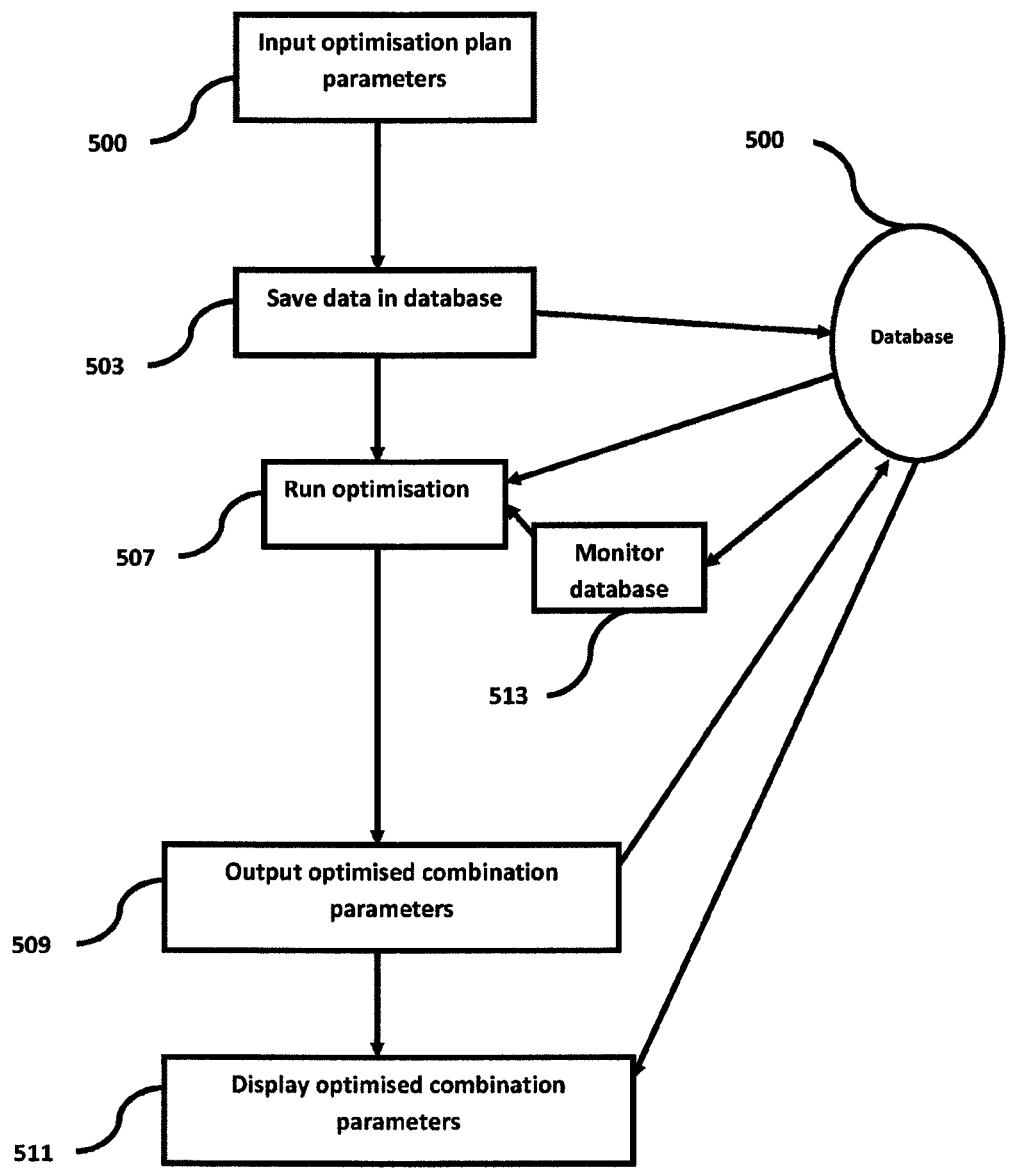
FIG. 4 is a flow diagram of the optimization procedure in accordance with an embodiment of the present invention.

Referring to FIG. 4, there is illustrated a flow diagram of the optimization procedure implemented by the data processing apparatus 28 in accordance with an embodiment of the present invention.

At step 500, a user uploads acquired component attribute information/data and input optimization plan parameters into the system; for example by manually inputting it. The data is saved into a database 505 which may be implemented on HDD 68 or a remote memory store as shown at step 503. Visual Basic Application (VBA) modules validate the user's input data against validation criteria set in the VBA modules. An example of an input interface display screen is shown in FIG. 5. The input interface provides data input fields for the quality bounds of the taste factors. The Quantity of available tuna A and tuna B is also indicated in respective fields.

The component or ratio bounds are also controlled from this input display. The user can adjust the ratio of combining components in order to control taste or to meet operational and/or supply constraints inherent in supplying each combination component. For example, one combination component may need to be used in a specific time period. Therefore, the user can control the specific component usage rate to satisfy the operational constraint while meeting taste targets. The quantity of available tuna A and B required at a particular time is also indicated in respective fields. This requirement ensures an appropriate amount of safety stock is available to meet taste and supply targets. Additionally, this interface provides the ability to input the start and end date of the analysis period, as well as record comments and track previously executed combination plans over time (Plan ID and Revision ID).

The VBA modules run an optimization sequence at step 507 by accessing the information in the database 505. The optimization sequence may be implemented using any suitable optimization routine such as the interior point methods (see FIGS. 7 and 8 for more detail). For example, the system of linear equations can be solved using Cplex optimizing software available from International Business Machines Inc™, Armonk, N.Y. A range of possible solutions can be produced. The possible solutions represent the combination plans that define the inputs to use, resources to use and products to be made. The routine generates output optimization combination parameters at step 509. The generated parameters 24 are relayed back to the database 505. The VBA modules read the data from the database and then display this information on an output display screen as indicated at step 511. An example of the output display screen is illustrated in FIG. 6, which shows the associated costs which each of the combinations of different component ratios and amounts having their corresponding attribute values.

From this display of optimized combination parameters, a user may select a desired product combination for a given period. The quantity, or ratio, of each component, for each time period, is the optimal product combination plan which represents the user defined target attribute taste profile. These quantities are used to generate purchase decisions and implement the combination plan to meet consumer demand. The parameters for the selected product combination plan may be input automatically to the control unit 29 or manually input.

The database 500 is also continuously monitored, at step 513. When the database monitor detects a newly uploaded optimization plan, it automatically initiates the optimization sequence at step 507 so as to generate new optimization combination parameters at step 509. Hence, for example, if the optimization plan parameters change in that the availability of a particular component becomes scarce, this information will be saved to the database 505, and the new optimization parameters may then be calculated on that basis. From the updated optimization parameters, the user or operator may adjust the control unit 29 settings so as to produce a product in accordance with the new optimized combination parameters, and/or the new parameters may automatically be input to the control unit 29.

Figure 7:
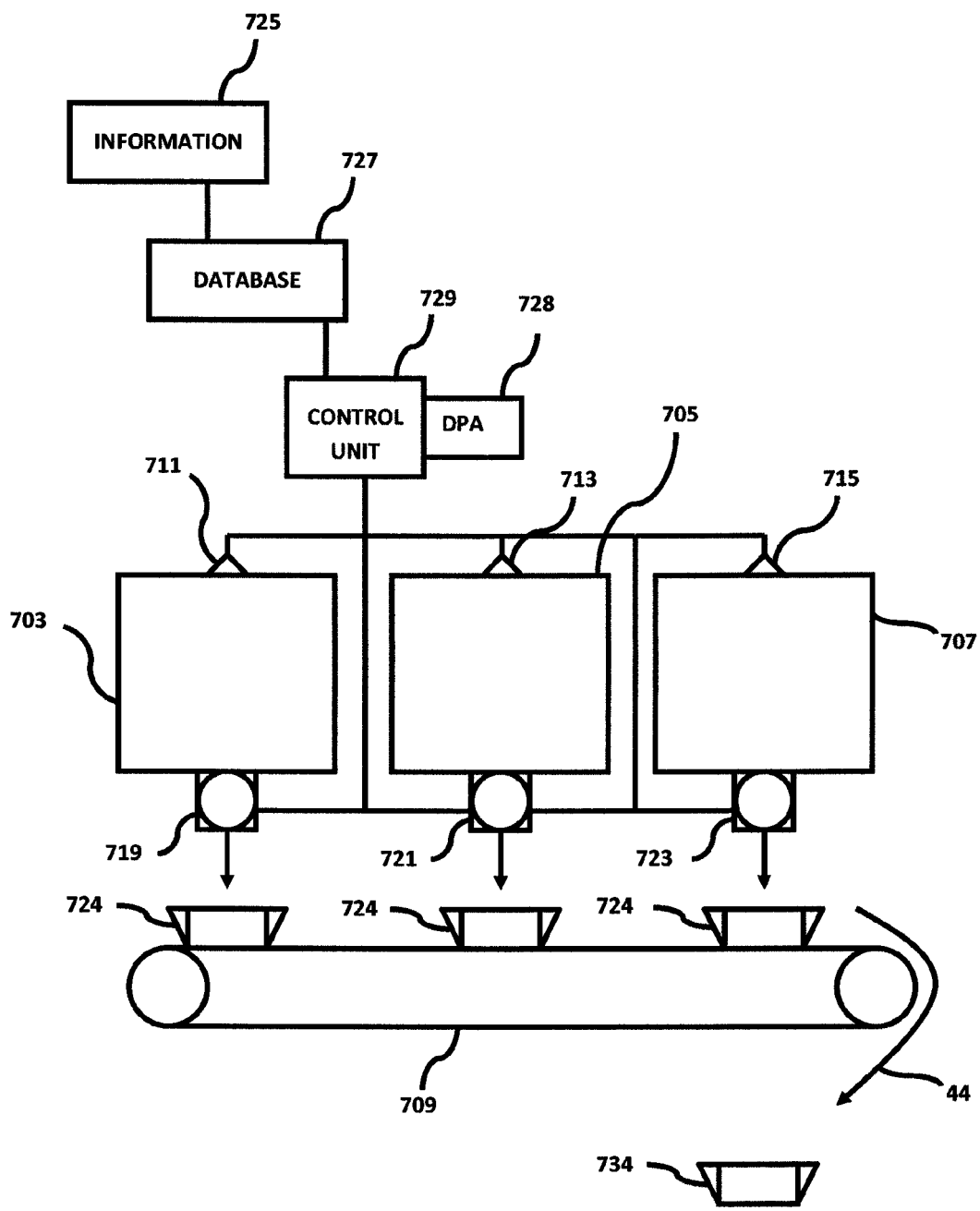
FIG. 7 is a schematic representation of a system for the production of a multi-component product in accordance with an alternative embodiment of the present invention.

Referring now to FIG. 7, there is shown a schematic representation of a system for the production of a multi-component product, having a product attribute profile, in accordance with an alternative embodiment of the present invention. The system is generally indicated 701.

The system 701 is similar to that shown in FIG. 1.

The system 701 comprises a database 727 for storing information 725 concerning consumer preferences in terms of the measurable properties or attributes of the components. The information 725 also includes constraints including supply, demand and cost of particular components. The system 701 also comprises three product component vessels 703, 705 and 707, which feed into a formulation zone constituted by a conveyor belt 709. The vessels 703, 705 and 707 and conveyor belt 709 are provided with monitoring devices 711, 713, 715 and 717 respectively. Each vessel 713, 715 and 717 is also provided with a dispenser 719, 721 and 723, respectively for controlling the flow of respective components to the conveyor belt 709.

The monitoring devices 711, 713, 715 and 717 monitor the properties of the product components and final product in respective vessels 703, 705 and 707 and conveyor belt 9 and supply this information to the database 727 via the control unit 729. In this embodiment, vessel 703 contains chicken, vessel 705 contains vegetables A and vessel 707 contains vegetables B. Measurable properties or attributes of the respective components and the product (pie) include for example the quality and component concentrations may be monitored. The monitoring devices 711, 713, 715 and 717 include, either integrally or remotely, analytical apparatus for performing High Performance Liquid Chromatography and Gas Chromatography (not shown).

Information 725 acquired on consumer preferences, including taste attributes of preferred chicken content, vegetable content and texture are supplied to the database 727. Control unit 729 may include data processing apparatus 728 such as schematically illustrated in FIG. 2. Here, there is shown a schematic and simplified representation of an illustrative implementation of a data processing apparatus 728 in the form of a computer system.

The data processing apparatus 728 is further configured to deduce the ratio of product components (e.g. ratio of chicken to vegetables content) necessary to achieve a pie product having an attribute profile satisfying the target attribute profile. Thus, formulating a product may be controlled automatically following deduction of the product component ratios or amounts for satisfying the target attribute profile. Optionally, parameters representing the ratio or amounts may be displayed to a user on a display screen 52 and control unit 729 configured with those parameters by a user. The ratio can be input to the control unit 729, which in turn operates dispensers 719 and 721 to dispense product components in the desired ratio to the pie pastry 724 of conveyor belt 709. Combining occurs on the conveyor belt 709. The amount of the vegetables A and chicken in the pie can be controlled in real-time by adjusting the flow of the components to the conveyor belt 709 based on readings from the monitoring device 717 fed back to control unit 729. The components are combined to yield a formulation satisfying the target product attribute profile.

In this and other embodiments, information 725 may include more than information concerning consumer preferences; for example, estimated product sales based on product component attributes, product component availability and cost per component of the product. This information may be continually updated and input to the database 727. The control unit 729 also receives current information on the attribute profile of each component from the monitoring devices 711, 713, 715 (before combining has occurred). The control unit 729 also receives current information on the attribute profile of the formulated product from the monitoring device 717 (after combining has occurred). The status of the attribute profiles of the components and the pie product are, therefore, known by way of the monitoring devices 711, 713, 715 and 717. In an optional embodiment, the updated attribute profile status is input to data processing apparatus 728 which is configured to be responsive to the updated status to deduce an updated component ratio and forward the ratio to control unit 729. The control unit 729 then sends control signals to the relevant valves 719, 721 and/or 723 to adjust the dispensation of components to the conveyor belt 709.

Following a change or predicted change (based on acquired information 725) in a component attribute profile, for example the reduced availability of vegetables A, the change is included in information 725 and supplied to the database 727. The data processor 728 accesses the information 725 in the database 727 and establishes whether the change or predicted change will result in an unacceptable deviation from the target product attribute profile. If such a deviation is identified, the data processor 728 deduces how best to counteract the deviation by generating an updated component ratio which more closely yields the target product attribute profile.

The data processor 728 can establish that a deviation is likely to occur due to the reduced availability of sugar. In this particular case, the data processor algorithm generates a solution to this problem; more particularly an adjusted ratio/combination of the components which would minimize the deviation owing to the reduced availability of vegetables A. In this embodiment, the data processor 728 calculates that the vegetables A of vessel 705 can be replaced by vegetables B of vessel 707 due to similar component attributes, whereby to minimize the deviation of the target and current product attribute profiles.

Using the calculated adjustment, an operator can manipulate the control unit 729 to make said adjustment to the combination in conveyor belt 709 by closing dispenser 721, belonging to vessel 705, and opening dispenser 723, belonging to vessel 707. The adjustment is made by effectively replacing vegetables A with vegetables B. Of course, in other embodiments, a component may not be entirely replaced; instead the amount supplied of a particular component may change. Optionally, the adjustment may be made automatically in that updated control parameters to modify the product component ratio/amount input to the conveyor belt 709 are sent to the control unit 729. The control unit 729 may then send control signals to valves 719, 721 and 723 to adjust the dispensation of components to incorporate vegetable B from vessel 707.

Following said adjustments, resulting pie 734 comprising chicken and vegetables B may be taken off the conveyor belt 709.

In this embodiment, the pie pastry 724 moves along the conveyor belt 709 in the direction indicated by arrow 726.

The pie pastry, also constituting a component of the product, is filled with other components including chicken and vegetables A or B along its travel. The pie product 734 comprises components of the pie pastry, chicken, and vegetables B (following adjustment).

Figure 8:
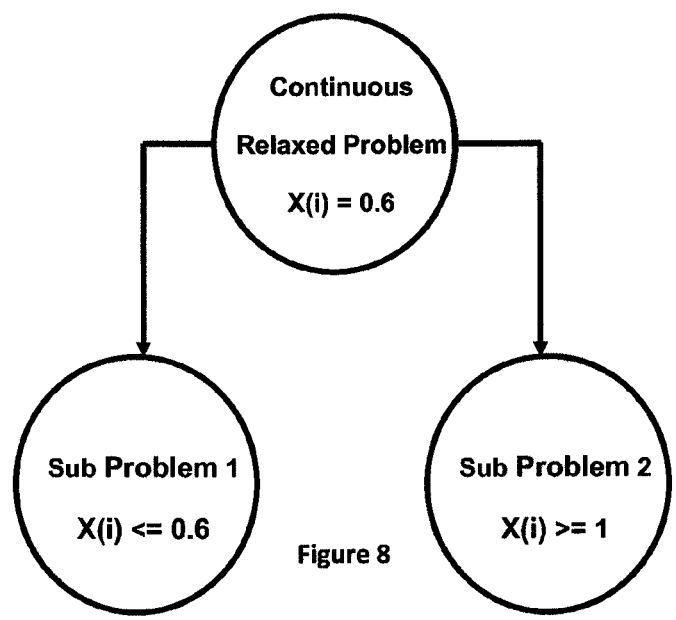
FIG. 8 is a diagram of a two dimensional linear integer program.
Figure 9:
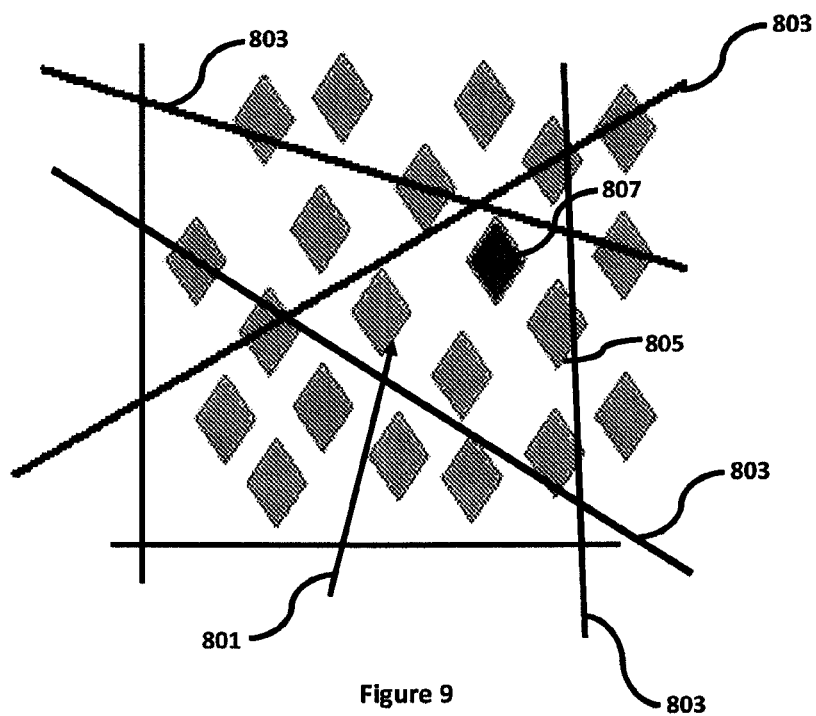
FIG. 9 is a graphical representation of an interior point method model.

Referring now to FIGS. 8 and 9, there is depicted a two dimensional linear integer program and a graphical representation of an interior point method model, respectively. More particularly, FIG. 8 shows the parent relaxed problem and the first two sub-problems from branching on variable X(i).

The objective function 801 and constraints 803 combine to form a math program. The solution method optimizes the objective function subject to the constraints 803. In this embodiment, a branch and bound algorithm is used to solve the math program. The integer requirements are relaxed and the math program is solved as a continuous variable problem. This relaxed problem can be solved using an interior point algorithm, or a gradient descent algorithm. A variable is selected to 'branch' on based on the partial derivative of the objective function, projected onto the constraint surface, with respect to the variable. Along one branch the branching variable is constrained to be less than or equal to the next lowest integer value 805, while along the other branch the branching variable is constrained to be greater than or equal to the next highest value (see FIG. 8). The resulting sub-problems are solved until an optimal solution 807 is found that obeys all constraints and integrality requirements.

As can be seen from FIG. 9, the optimal feasible solution 807 is that point which is within the bounds but maximizes the objective function 801. Although, 29 the integer point 805 to the bottom right of the optimal integer point 807 may provide greater attribute function in some respects, this integer point 805 falls outside the constraint 803 bounds set and thus cannot be considered the optimal solution 807.

In other embodiments, a branch and cut algorithm may be used, and branch and bound and branch and cut can be used in combination.

It is to be understood that any feature described in relation to any one embodiment may be used alone, or in combination with other features described, and may also be used in combination with one or more features of any other of the embodiments, or in combination of any of the embodiments.

Insofar as embodiments of the invention described are implementable, at least in part, using a software-controlled programmable processing device such as a general purpose processor or special-purposes processor, digital signal processor, microprocessor, or other processing device, data processing apparatus or computer system it will be appreciated that a computer program for configuring a programmable device, apparatus or system to implement the foregoing described methods, apparatus and system to implement the foregoing described methods, apparatus and system is envisaged as an aspect of the present invention. The computer program may be embodied as any suitable type of code, such as a source code, object code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, JAVA, Active X, assembly language, machine code, and so forth. A skilled person would readily understand the term "computer" in its most general sense encompasses programmable devices such as referred to above, and data processing apparatus and computer systems.

Suitably, the computer program is stored on a carrier medium in machine readable form, for example the carrier medium may comprise memory, removable or non-removable media, erasable or non-erasable media, writable or re-writable media, digital or analogue media, hard disk, floppy disk. Compact Disk Read Only Memory (CD-ROM), Compact Disk Recordable (CD-R), Compact Disk Rewritable (CD-RW), optical disk, magnetic media, magneto-optical media, removable memory cards or disks, various types of Digital Versatile Disk (DVD) subscriber identify module, tape, and cassette solid-state memory. The computer program may be supplied from a remote source embodied in the communications medium such as an electronic signal, radio frequency carrier wave or optical carrier waves. Such carrier media are also envisaged aspects of the present invention.

As used herein, the terms "comprises", "comprising", "includes", "including", "has", "having" or any other variation thereof, are intended to cover a non-exclusive inclusion. For example, a process, method, article, or apparatus that comprises a list of elements is not necessarily listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the invention. This is done merely for convenience and to give a general sense of the invention. This description should be read to include one or at least one and the singular also includes the plural unless it is obvious that it is meant otherwise.

The scope of the present disclosure includes any novel feature or combination of features disclosed therein either explicitly or implicitly or any generalization thereof irrespective of whether or not it relates to the claimed 31 invention or mitigate against any or all of the problems addressed by the present invention. The applicant hereby gives notice that new claims may be formulated to such features during prosecution of this application or any such further application derived therefrom. In particular, with reference to the appended claims, feature from dependent claims may be combined with those of the independent claims and features from respective independent claims may be combined in any appropriate manner and not merely in specific combinations enumerated in the claims.

I claim:

1. A method of producing a multi-component product including a product attribute profile, the method comprising:
   providing a first and second component of the product, each component having a component attribute profile;
   supplying to a product formulation zone the first component and the second component in desired amounts based on a combinatorial relationship between respective data values of the physical attributes;
   combining the first and second components together to provide a combined attribute profile within predetermined limits of the multi-component product attribute profile so as to yield a target product attribute profile;
   responsive to a change or predicted change in at least one component attribute profile, supplying information concerning the attribute change to a data processing apparatus; and
   calculating with respect to that change an adjustment in the amounts of the first and second components to reduce the deviation of one or more attributes of the product attribute profile from the target product attribute profile.

2. The method of claim 1, further comprising storing said information in a database and supplying said information to said data processing apparatus from said database.

3. The method of claim 1, further comprising monitoring the attribute profile of each of the first and second components.

4. The method of claim 1, further comprising monitoring the product attribute profile and responsive to a change or predicted change in an attribute of said product attribute profile supplying further information concerning said change to said data processing apparatus for use in calculating said adjustment.

5. The method of claim 1, wherein the first and second components reside in separate vessels before being combined.

6. The method of claim 5, wherein the vessels include valves for allowing controlled passage of the components to the product formulation zone.

7. The method of claim 1, wherein the at least one component attribute profile is selected from the cost of freight and storage of a particular component, cost of a particular component, quality of a particular component, consumer demand of a particular component, available supply of a particular component, and cost of processing.

8. The method of claim 1, wherein the method is a computer implemented method and the calculating step executed by a data processor.

9. A system for producing a multi-component product including a product attribute profile, the system comprising:
   one or more vessels configured to store a first and second component of the product of the multi-component product to be mass-produced, each component having a component attribute profile representative of respective physical attributes,
   a product formulation zone for combining the first and second component of the product in desired amounts based on a combinatorial relationship between respective data values of the physical attributes and effective to yield a target product attribute profile, the first and second component each having a component attribute profile,
   wherein the system comprises a data processing apparatus operable to receive information concerning a change or predicted change in at least one component attribute profile and, in response thereto, is operable to calculate with respect to that change an adjustment in the amounts of the first and second components to reduce the deviation of one or more attributes of the product attribute profile from the target product attribute profile.

10. The system of claim 9, wherein an attribute of at least one component of the product fluctuates over time.

11. The system of claim 9, further comprising means for adjusting the component amounts.

12. The system claim 9, wherein the means for storing the first and second components comprises separate vessels.

13. The system of claim 9, wherein the formulation zone comprises a combination chamber.

14. The system of claim 9, further comprising a database for storing said information.

15. The system of claim 9, further comprising at least one monitoring device for monitoring the attribute profile of each of the first and second components.

16. Use of the system according to claim 9 in regulating a multicomponent product attribute profile.

* * * * *